United States Patent
Lu

(10) Patent No.: US 12,495,541 B2
(45) Date of Patent: Dec. 9, 2025

(54) MEMORY STRUCTURE AND METHOD OF FORMING THEREOF

(71) Applicant: NANYA TECHNOLOGY CORPORATION, New Taipei (TW)

(72) Inventor: Tseng-Fu Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 596 days.

(21) Appl. No.: 17/651,575

(22) Filed: Feb. 17, 2022

(65) Prior Publication Data

US 2023/0262965 A1    Aug. 17, 2023

(51) Int. Cl.
  *H10B 12/00*   (2023.01)
  *H01L 21/308*  (2006.01)
  *H01L 21/762*  (2006.01)

(52) U.S. Cl.
  CPC ....... *H10B 12/488* (2023.02); *H01L 21/3081* (2013.01); *H01L 21/76224* (2013.01); *H10B 12/038* (2023.02); *H10B 12/053* (2023.02)

(58) Field of Classification Search
  CPC combination set(s) only.
  See application file for complete search history.

(56) References Cited

U.S. PATENT DOCUMENTS

| 2006/0097314 A1* | 5/2006 | Uchiyama | H10B 12/053 257/E29.267 |
| 2006/0211192 A1 | 9/2006 | Cho et al. | |
| 2008/0277725 A1* | 11/2008 | Shino | H10D 86/01 257/E27.085 |
| 2012/0264280 A1 | 10/2012 | Seo et al. | |
| 2013/0264621 A1 | 10/2013 | Nishi et al. | |
| 2021/0005614 A1* | 1/2021 | Lin | H10B 12/34 |
| 2023/0187512 A1* | 6/2023 | Lu | H01L 29/4236 257/288 |

OTHER PUBLICATIONS

Jonghyuk Kang et al, DRAM Weak Cell Characterization for Retention Time, Journal of Nanoscience and Nanotechnology, vol. 16, 5092-5095, 2016.

* cited by examiner

*Primary Examiner* — Brigitte A Paterson
(74) *Attorney, Agent, or Firm* — CKC & Partners Co., LLC

(57) ABSTRACT

A memory structure includes a substrate, an isolation area, a plurality of active areas and a first word line. The isolation area and the active areas are formed on the substrate. The isolation area surrounds the active areas, and the isolation area comprises an isolation structure formed in an isolation trench recessed in the isolation area. The first word line is formed across a first active area of the active areas and the isolation area. The first word line has a first width in the first active area and a second width in the isolation area. The first width is less than the second width.

11 Claims, 14 Drawing Sheets

MEMORY STRUCTURE AND METHOD OF FORMING THEREOF

BACKGROUND

Field of Invention

The present disclosure relates to memory structures and a method of forming a memory structure.

Description of Related Art

In advance memory technology, the retention performance is dominated by lots kinds of leakage effect. The gate induced drain leakage (GIDL) is one of the main contributions for retention. Shapes of the active areas for an access device are key factor for retention time. The shape corners of the active areas create high electric field and a higher gate induced drain leakage is introduced by such high electric field.

Therefore, how to form word lines with smooth shapes at corners for a memory device is one of the subjects to be solved for the industry.

SUMMARY

An aspect of the present disclosure is related to a memory structure.

According to one embodiment of the present disclosure, a memory structure includes a substrate, an isolation area, a plurality of active areas and a first word line. The isolation area and the active areas are formed on the substrate. The isolation area surrounds the active areas, and the isolation area comprises an isolation structure formed in an isolation trench recessed in the isolation area. The first word line is formed across a first active area of the active areas and the isolation area. The first word line has a first width in the first active area and a second width in the isolation area. The first width is less than the second width.

In one or more embodiments of the present disclosure, a top surface of the isolation structure is lower than top surfaces of the active areas.

In some embodiments, the memory structure further includes a mask layer. The mask layer is formed in the isolation trench and upon the top surface of the isolation structure.

In some embodiments, the mask layer laterally surrounds the first word line in the isolation area. A top surface of the mask layer is coplanar with the top surface of the first active area and a top surface of the first word line.

In one or more embodiments of the present disclosure, the memory structure further includes a second word line and a bit line structure. The second word line is formed across the isolation area and the first active area. The bit line structure is formed on the first active area and located at a portion of the first active area between the first word line and the second word line.

In some embodiments, the portion of the first active area between the first word line and the second word line, the first word line and a portion of the first active area between the first word line and the isolation area form a first transistor. The portion of the first active area between the first word line and the second word line, and the second word line and a portion of the first active area between the second word line and the isolation area form a second transistor.

In one or more embodiments of the present disclosure, the memory structure further includes a third word line and a capacitor structure. The third word line is formed across the isolation area and a second active area of the active areas. The third word line has the first width in the second active area and the second width in the isolation area. The capacitor structure is formed on the first active area and between the first word line and the third word line.

In one or more embodiments of the present disclosure, the first word line is formed within a first word line trench across the first active area and the isolation area. The first word line comprises a gate dielectric, a gate structure and a dielectric layer. The gate dielectric is conformally formed in the first word line trench. The gate structure is formed on the gate dielectric. The dielectric layer is formed in the first word line trench and covers the gate structure.

In some embodiments, a top surface of the isolation structure is lower than a top surface of the dielectric layer.

An aspect of the present disclosure is related to a memory structure.

According to one embodiment of the present disclosure, a memory structure includes a substrate, a first word line and a mask layer. The substrate has a plurality of active areas and an isolation area surrounding the active areas. The isolation area includes an isolation structure recessed from a top surface of the substrate. The first word line is formed across a first active area of the active areas and the isolation structure of the isolation area. The mask layer is formed upon the isolation structure and filled with an isolation trench in which the isolation structure is formed. The mask layer laterally surrounds the first word line in the isolation area.

In one or more embodiments of the present disclosure, the first word line has a first width in the first active area and a second width in the isolation area. The first width is less than the second width.

In some embodiments, the first word line is extended along a first direction differ from a second direction in which the active areas are extended. First sections with the first width and second sections with the second width of the first word line are alternately arranged along the first direction.

In some embodiments, the memory structure further includes a second word line and a bit line structure. The second word line is formed across the isolation area and the first active area. The second word line has the first width in the first active area and the second width in the isolation area. The bit line structure is formed on the first active area and located at a portion of the first active area between the first word line and the second word line.

In some embodiments, the memory structure further includes a third word line and a capacitor structure. The third word line is formed across the isolation area and a second active area of the active areas. The third word line has the first width in the second active area and the second width in the isolation area. The capacitor structure is formed on the first active area and between the first word line and the third word line.

An aspect of the present disclosure is related to a method of forming a memory structure.

According to one embodiment of the present disclosure, a method of forming a memory structure includes following operations. An isolation structure is formed in in an isolation trench of an isolation area of a substrate, wherein the isolation area surrounds a plurality of active areas of the substrate. The isolation structure is recessed such that a top surface of the isolation structure is lower than top surfaces of the active areas and a sidewall of the isolation trench is exposed. A mask layer covering the active areas and being filled with the isolation trench is formed. The mask layer is patterned to form a plurality of patterned trenches extended over the active areas and the isolation structure in the mask layer, wherein each of the patterned trenches has a first depth from one of the top surfaces to a top surface of the mask layer and a second depth from a top surface of the isolation structure to the top surface of the mask layer, and the first depth is less than the second depth. A first word line trench extended across a first active area of the active areas and the isolation structure is formed based on the patterned trenches, wherein the first word line trench has a first width in the first active area and a second width in the isolation structure, and the first width is less than the second width. A first word line is formed in the first word line trench such that the first word line has the first width in the first active area and the second width in the isolation structure.

In one or more embodiments of the present disclosure, the method further includes following operation. After the first word line is formed, the mask layer over the first active area and beyond the isolation trench in the substrate is polished.

In one or more embodiments of the present disclosure, patterning the mask layer further includes follow operations. A photoresist layer is formed over the mask layer, wherein the photoresist layer has a pattern with a plurality of slots, and the slots have the same width. The mask layer is patterned based on the photoresist layer with the pattern.

In one or more embodiments of the present disclosure, forming the first word line includes following operations. A gate dielectric is conformally formed in the first word line trench. A gate structure is formed over the gate dielectric in the first word line trench. A dielectric layer covering the gate structure is formed in the first word line trench.

In one or more embodiments of the present disclosure, the method further includes following operations. A bit line structure is formed on the first active area, wherein the bit line structure is formed between the first word line and a second word line across the first active area.

In one or more embodiments of the present disclosure, the method further includes following operations. A capacitor structure is formed on first active area, wherein the capacitor structure is formed between the first word line and a third word line across a second active area of the active areas.

In summary, widths of the word lines in different positions can be controlled, so that corners of the word lines at boundaries of different region have smooth shapes.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

DETAILED DESCRIPTION

Figure 1A:
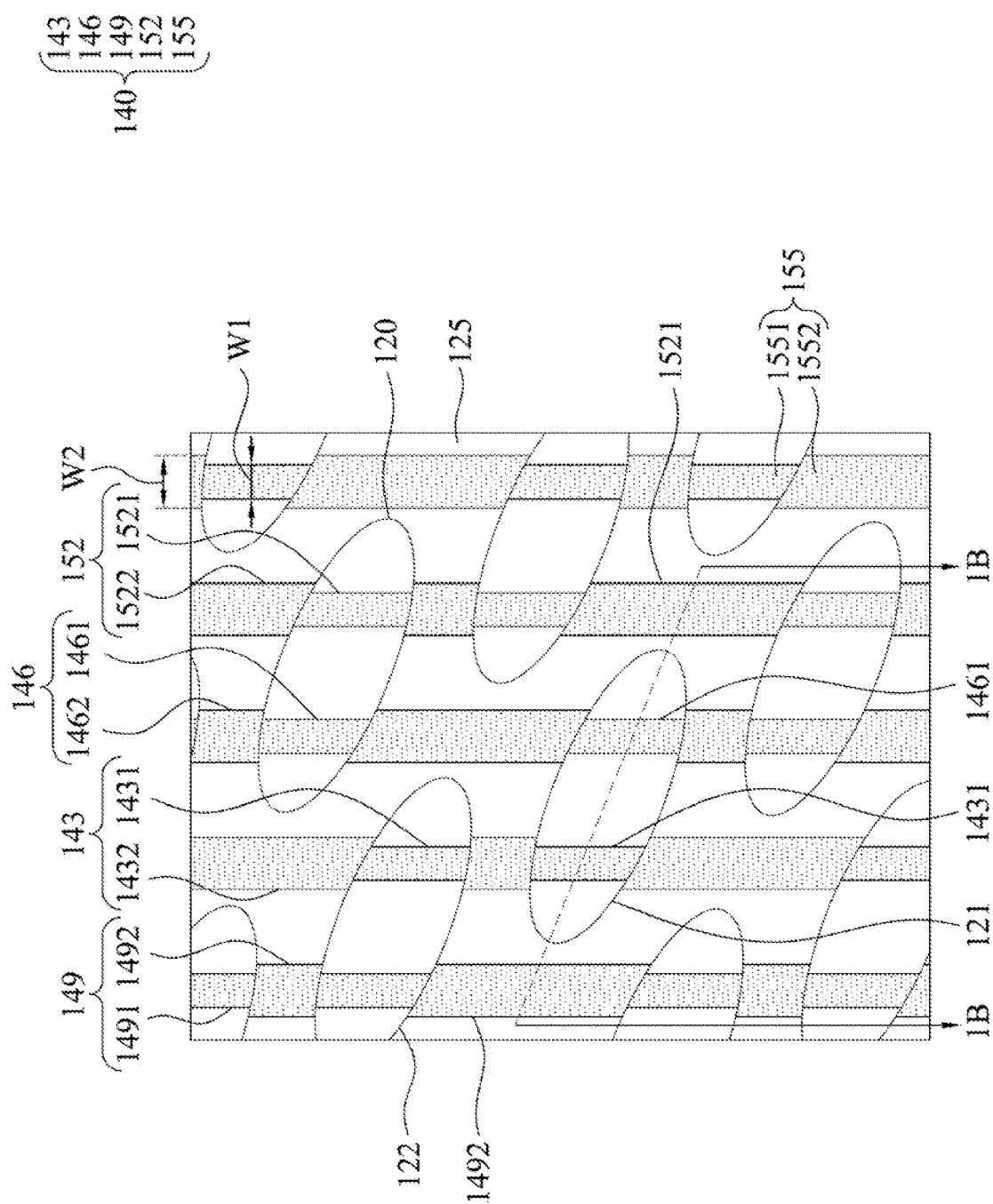
FIG. 1A illustrates a schematic top view of a local of a memory structure of the present disclosure.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

The retention performance of the memory devices is affected by leakage current. The leakage current is caused by, for example, subthreshold leakage, gate induced drain leakage (GIDL), junction leakage and/or cell leakage. Among these current leakage effects, the GIDL is the main contribution for retention performance. Except the junction engineering consideration, the active area shape of an access device of the memory device is one of the key factors for the retention time. High electric field would be caused by a sharp corner at an edge of the active area, thereby inducing GIDL.

Forming a rounding shape for conductive structures in the active area of the memory device is helpful for vanishing GIDL. However, it is difficult to form rounding shapes by a conventional circuit design tool, for example, a graph design system (GDS). Photo resolution for forming the circuit design with rounding shapes is a challenge. Further, the over layer forming must be well controlled between the conductive structure photo and the active areas, and the active area pattern cannot meet the requirement for forming a rounding shape reducing leakage current.

In order to control the formed conductive structures in the active area, memory structures and methods of forming such memory structures is provided in the present disclosure, and the leakage current caused by sharp corners of the active area can be reduced.

Figure 1B:
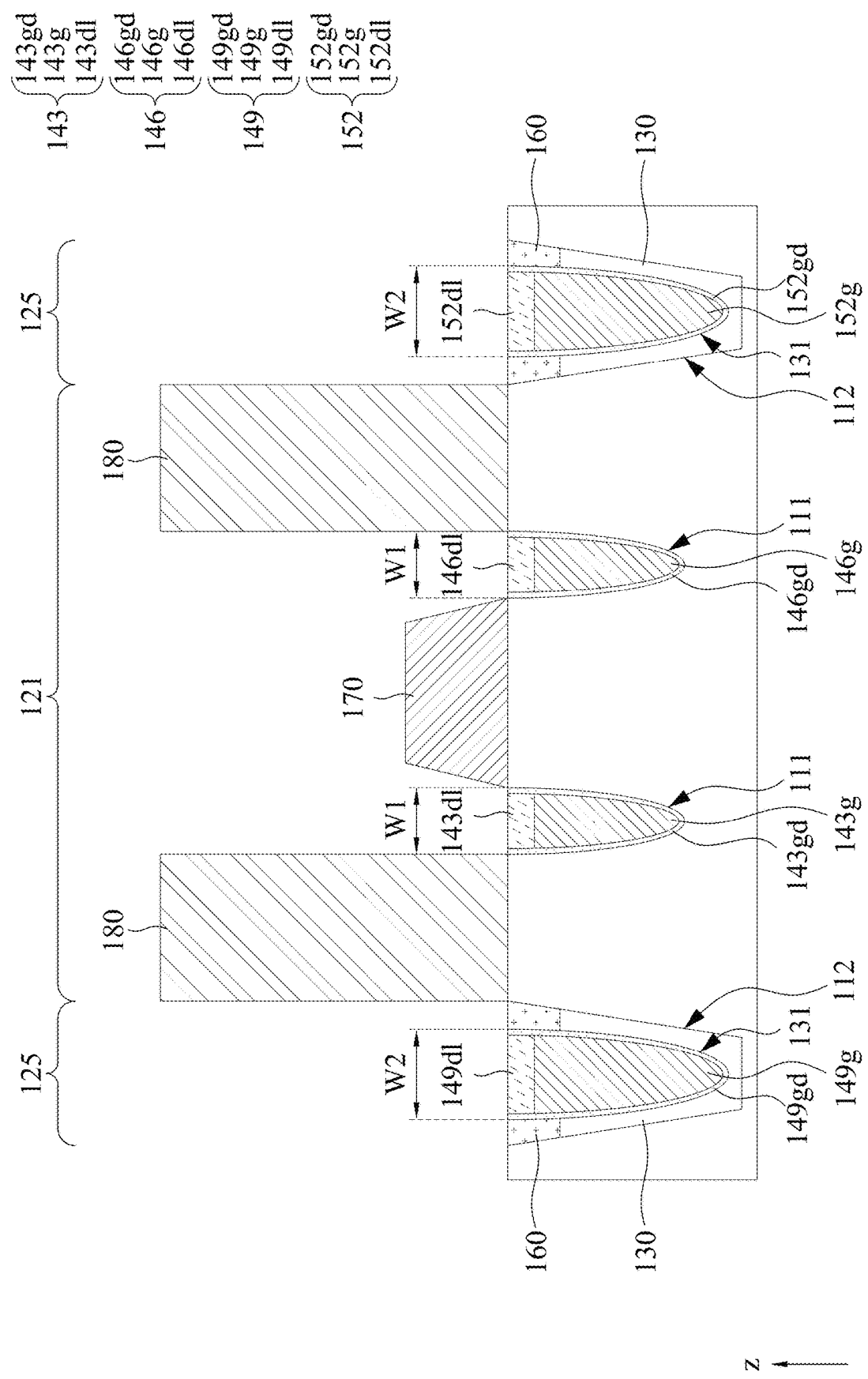
FIG. 1B illustrates a schematic cross-section view along of FIG. 1A.

Reference is made by FIG. 1A and FIG. 1B. FIG. 1A illustrates a schematic top view of a local of a memory structure 100 of the present disclosure. FIG. 1B illustrates a schematic cross-section view of FIG. 1A.

In this embodiment, the memory structure 100 includes a substrate 110, a plurality of active areas 120 formed on the substrate 110, and an isolation area 125 formed around the active areas 120 and a plurality of word lines 140 formed over the isolation area 125 and one or more of the active areas 120. In the local top view of FIG. 1A, the word lines 140 include word lines 143, 146, 149, 152 and 155.

It should be noted that some elements of the memory structure 100 are ignored for the purpose of simple description. For example, bit line structures and capacitor structures in the memory structure 100 are not shown in FIG. 1A.

As shown in FIG. 1A, in this embodiment, the word lines 140 are extended along the direction y. The active areas 120 are arranged along a direction beyond a direction x and the direction y. As shown in FIG. 1A, two word lines 140 are extended through one of the active areas 120. For example, two word lines 143 and 146 are extended over an active area 121 of the active areas 120. Alternatively, two word lines 143 and 149 are extended over an active area 122 of the active areas 120.

FIG. 1B schematically illustrate a schematic cross-section view with the isolation area 125 and an active area 121 in which two word lines 143 and 146 extend across. As shown in FIGS. 1A and 1B, the active area 121 is surrounded by the isolation area 125. The isolation area 125 is configured to isolate the active area 121 from other of the active areas 120. In other words, the isolation area 125 defines the active areas 120 such that the active areas 120 are isolated from each other.

As shown in FIG. 1B, in this embodiment, an isolation trench 112 is formed in the isolation area 125 and recessed from a top surface of the substrate 110. An isolation structure 130 is formed in the isolation trench 112. The isolation structure 130 is used as an electric insulator, so as to avoid unexpected leakage current from one of the active areas 120 to other active areas 120.

In this embodiment, a top surface of the isolation structure 130 is lower than a top surface of the substrate 110 in the active area 121, and a mask layer 160 is further remained on the top surface of the isolation structure 130. The remained mask layer 160 is able to increase the critical size of the word lines 140 in the isolation area 125. For details, please refer to following discussion.

Referring to FIGS. 1A and 1B, in this embodiment, the word lines 143 and 146 are buried in the active area 121, and the word lines 149 and 152 are buried in the isolation structure 130 in the isolation area 125 at two sides of the active area 121. As shown in FIG. 1A, each of the word lines 143, 146, 149 and 152 are extended across the isolation area 125 and a plurality of the active areas 120, and each of the word lines 143, 146, 149 and 152 has different width in the active areas 120 and the isolation area 125.

As shown in FIG. 1A, in this embodiment, each of the word lines 140 has a width W1 in the active areas 120 and a width W2 in the isolation area 125 along a direction x perpendicular to the direction y in which the word lines 140 extend. For example, the word line 143 has a plurality of first sections 1431 in the active areas 121 and 122 and a plurality of second sections 1432 in the isolation area 125, and the first sections 121 and the second sections are alternately arranged along the direction y. Each of the first section 1431 has a width W1 and each of the second section 1432 has a width W2, and the width W1 is less than the width W2.

Similarly the word line 146 has first sections 1461 over the active areas 120 and second sections 1462 over the isolation area 125, and each of the first section 1461 has a width W1 and each of the second section 1432 has a width W2. The word line 149 also has first sections 1491 with the width W1 and second sections 1492 with the width W2 alternately arranged along the direction y. The word line 152 includes first sections 1521 with the width W1 and the second section 1522 with the width W2, and the word line 155 includes first sections 1551 with the width W1 and the second section 1552 with the width W2.

Different widths (e.g. width W1 and width W2) in the active areas 120 and the isolation area 125 for the word lines 140 are able to form a smooth rounding shape in a boundary between the active areas 120 and the isolation area 125. For example, as mention above, the isolation area 125 is formed surrounding the active areas 121. The word line 143 across the active area 121 has a first section 1431 in the active area 121 and a second section 1432 in the isolation area 125. Since the isolation area 125 surrounds the active area 121 and the width W1 of the first section 1431 in the active area 121 is less than the width W2 of the second section 1432 in the isolation area 125, the second section 1432 is around the first section 1431 at the boundary between the active area 121 and the isolation area 125, thereby forming a rounding shape. The rounding shape avoids high electric field introducing, so as to reduce the leakage current.

Return to FIG. 1B. As shown in FIG. 1B, the word lines 143 and 146 are buried in the active area 121 and the word lines 149 and 152 in the isolation area 125, so that the word lines 143 and 146 are with the width W1 and the word lines 149 and 152 are with the width W2 in the cross-section of FIG. 1B.

As shown in FIG. 1B, in this embodiment, the word lines 143, 146, 149 and 152 have similar aspect ratio. Along the direction z, a depth of each of the word lines 143, 146 from the top surface of the active area 120 the substrate 110 is less than a depth of each of the word lines 149, 152 from the top surface of the substrate 110, and the width W1 of the word lines 143 and 146 in the active area 121 is less than the width W2 of the word lines 149 and 152 in the isolation area.

In this embodiment, each of the word lines 140 has a gate dielectric, a gate structure and a dielectric layer covering the gate structure. In FIG. 1B, the word line 143 is formed in a word line trench 111 in the active area 121 and includes a gate dielectric 143$gd$, a gate structure 143$g$ and a dielectric layer 143$dl$. The gate dielectric 143$gd$ is conformally formed over the word line trench 111. The gate structure 143$g$ is formed over the gate dielectric 143$gd$. The dielectric layer 143$dl$ filled in the word line trench 111 and covers the gate structure 143$g$, and the dielectric layer 143$dl$ can be regarded as a dielectric cap overlapping the gate structure 143$g$. Similar to the word line 143, the word line 146 includes a gate dielectric 146$gd$, a gate structure 146$g$ and a dielectric layer 146$dl$.

The word lines 149 and 152 also have structures similar to the word line 143 and 146. In cross-section of FIG. 1B, the word lines 149 and 152 are formed in the word line trenches 131, and, each of the word line trenches 131 extends through the mask layer 160 to the isolation structure 130. A gate dielectric 149$gd$ is formed over the isolation structure 130 and the mask layer 160, and a top surface of the isolation structure 130 is less than a top surface of gate dielectric 149$gd$. A gate structure 149$g$ and a dielectric layer 149$dl$ of the word line 149 are formed over the gate dielectric 149$gd$ within the word line trench 131. Similarly, the word line 152 includes a gate dielectric 152$gd$, a gate structure 152$g$ and a dielectric layer 152$dl$ formed within the word line trench 131, and a top surface of the isolation 130 is lower than a top surface of the gate dielectric 152$gd$.

It should be noted that the word lines 140 extend along the direction y, and the isolation structure 130 and the mask layer 160 laterally surround the word lines 140 in the isolation area 125.

In some embodiments, the gate structures (e.g. gate structures 143$g$, 146$g$, 149$g$ and/or 152$g$) of the word lines 140 include conductive material.

In some embodiments, the gate dielectrics (e.g. gate dielectrics 143$gd$, 146$gd$, 149$gd$ and/or 152$gd$) of the word lines 140 are oxide material. In some embodiments, the dielectric layer (e.g. dielectric layers 143*dl*, 146*dl*, 149*dl* and/or 152*dl*) of the word lines 140 are also oxide material. In some embodiments, material of the gate dielectrics (e.g. gate dielectrics 143*gd*, 146*gd*, 149*gd* and/or 152*gd*) is same as the dielectric layer (e.g. dielectric layers 143*dl*, 146*dl*, 149*dl* and/or 152*dl*).

In some embodiments, the isolation structure 130 in the isolation area 125 includes oxide, and the isolation structure 130 can be regarded as shallow trench isolation (STI).

In some embodiments, the substrate 110 is a semiconductor substrate, tops of the active areas 120 of the substrate 110 are implanted as source/drain implant regions, and the source/drain implant regions in the active areas and the gate structures of the word lines 140 form transistors. For example, the portion of the active area 121 between the word line 143 and the word line 146, the word line 143 and a portion of the active area 121 between the word line 143 and the isolation area 125 form a first transistor. The portion of the active area 121 between the word line 143 and the word line 146, and the word line 146 and a portion of the active area 121 between the word line 146 and the isolation area 125 form a second transistor. The first transistor with the gate structure 143*g* of the word line 143 and the second transistor with the gate structure 146*g* of the word line 146 form a common source structure.

As shown in FIG. 1B, a bit line structure 170 and the capacitor structures 180 are formed on the substrate 110. One of the capacitor structures 180 is formed a portion of the active area 121 between the word line 143 and the word line 149, wherein the word line 149 extends across another active area 122 and the isolation area 125 adjacent the active area 121. The bit line structure 170 is formed on a portion of the active area 121 between the word line 143 and the word line 146 in the active area 121. One capacitor structure 180 and one of the transistors in the active area 121 form a 1T1C memory cell connected to a corresponding bit line for a DRAM device. The transistor in a memory cell is a structure used to control a storage operation. In some embodiments for a 1T1C memory cell, the capacitor structures 180 are applied with a ground potential and the bit line structure 170 is applied with a charge voltage.

Reference is made by FIGS. 2-12 to further describe how a memory structure with word lines have two different widths in the present disclosure. FIGS. 2-12 illustrate cross-section views in different stages of forming a memory structure of the present disclosure.

Figure 2:
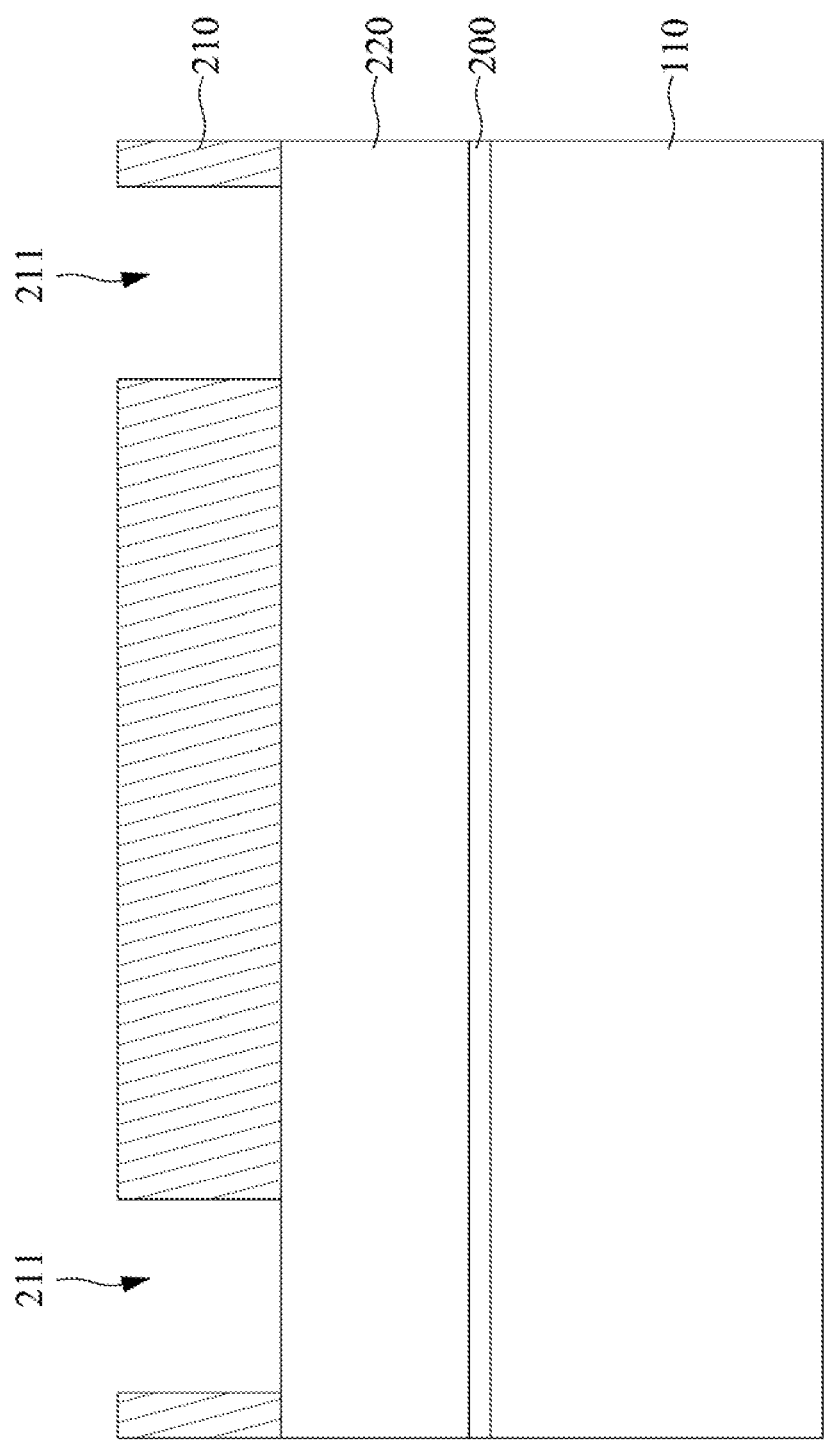
FIGS. 2-12 illustrate cross-section views in different stages of forming a memory structure of the present disclosure.

In FIG. 2, a substrate 110 is provided. An oxide layer 200 is formed on the substrate 110. A first mask layer 220 is formed on the oxide layer 200 above the substrate 110, and a first photoresist layer 210 used for patterning the first mask layer 220 is formed on the first mask layer 220. As shown in FIG. 2, the first photoresist layer 210 has pattern, which includes a plurality of slots 211.

In some embodiment, the mask layer 220 is a nitride layer.

Figure 3:
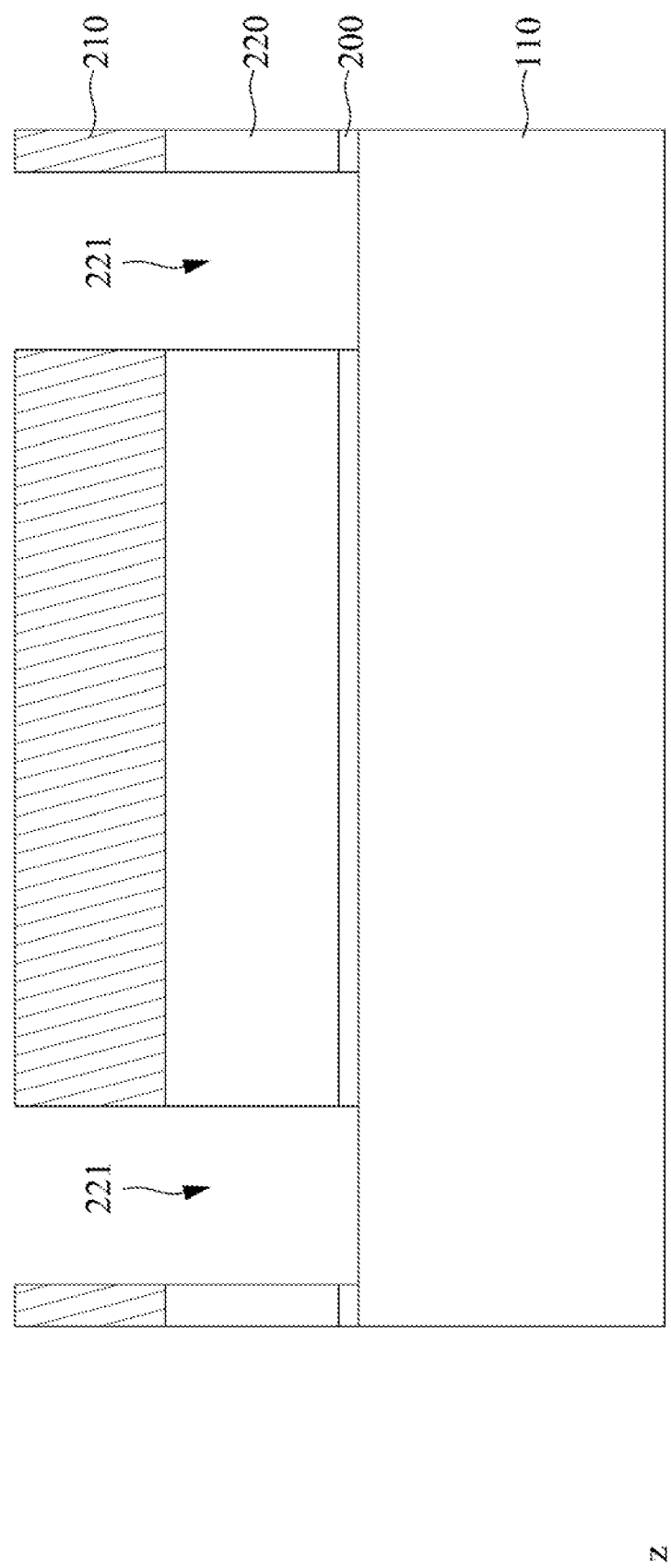

In FIG. 3, the mask layer 220 is patterned based on the pattern of the photoresist layer 221. The patterned trenches 221 are formed based on positions where the slots 211 of the photoresist layer 210 are aligned with. The formed pattered trenches extend through the mask layer 220 and the oxide layer 200 to a top surface of the substrate 110, so that the top surface of the substrate 110 is exposed from the patterned trenches 221.

Figure 4:
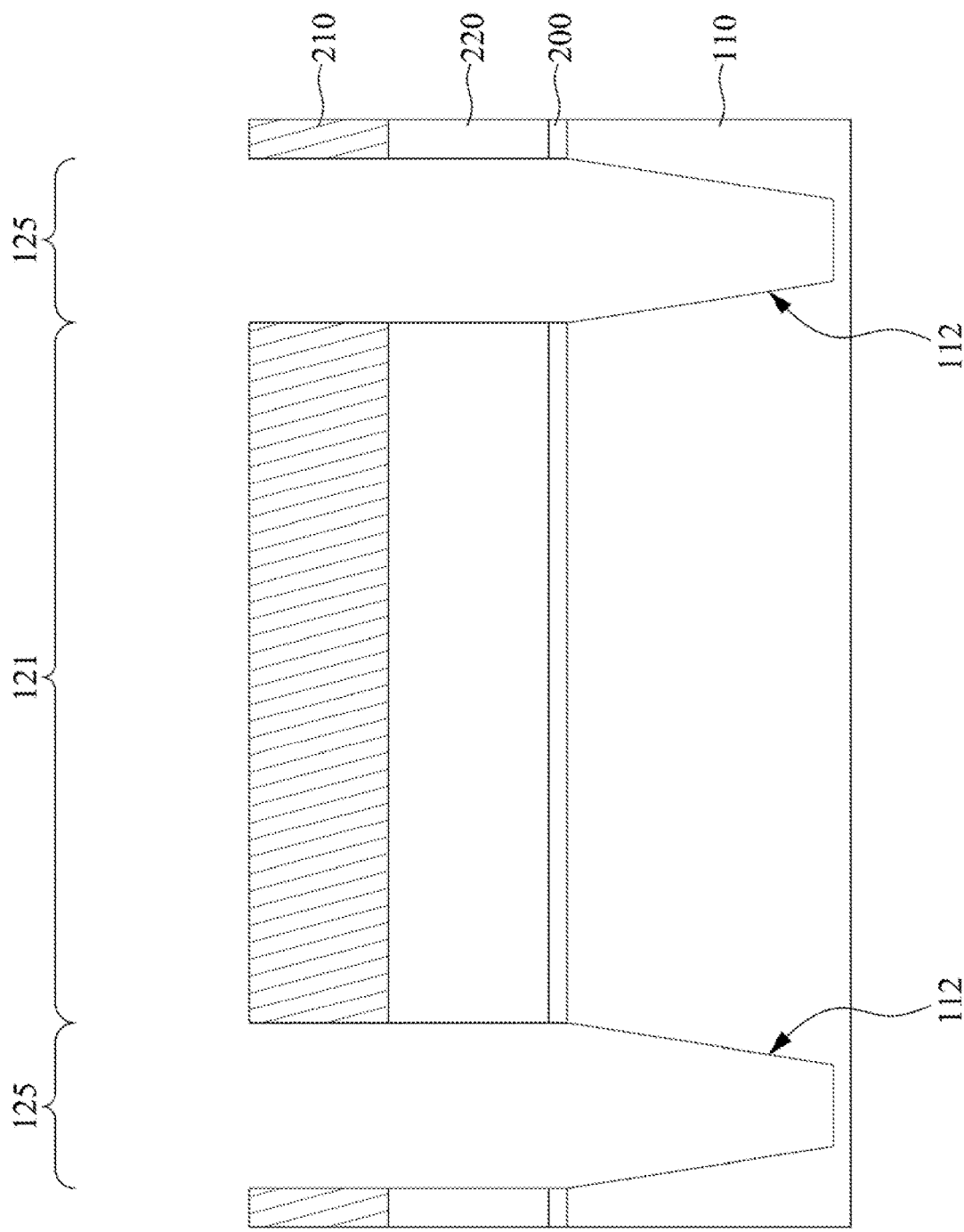

In FIG. 4, the substrate 110 is etched based on the mask layer 220 with patterned trenches 220, and an isolation trench 112 is formed in the substrate 110. The isolation trench 112 is extended from the top surface of the substrate 112 and used to accumulate following isolation structure.

The areas in which the isolation trench is formed on can be regarded as the isolation area 125 of the substrate 110, and the isolation trench 112 defines the active areas 120 surrounded by the isolation area 125. As shown in cross-section of FIG. 4, an area of the substrate 110 surrounded by the isolation trench 125 is defined as the active area 121.

Figure 5:
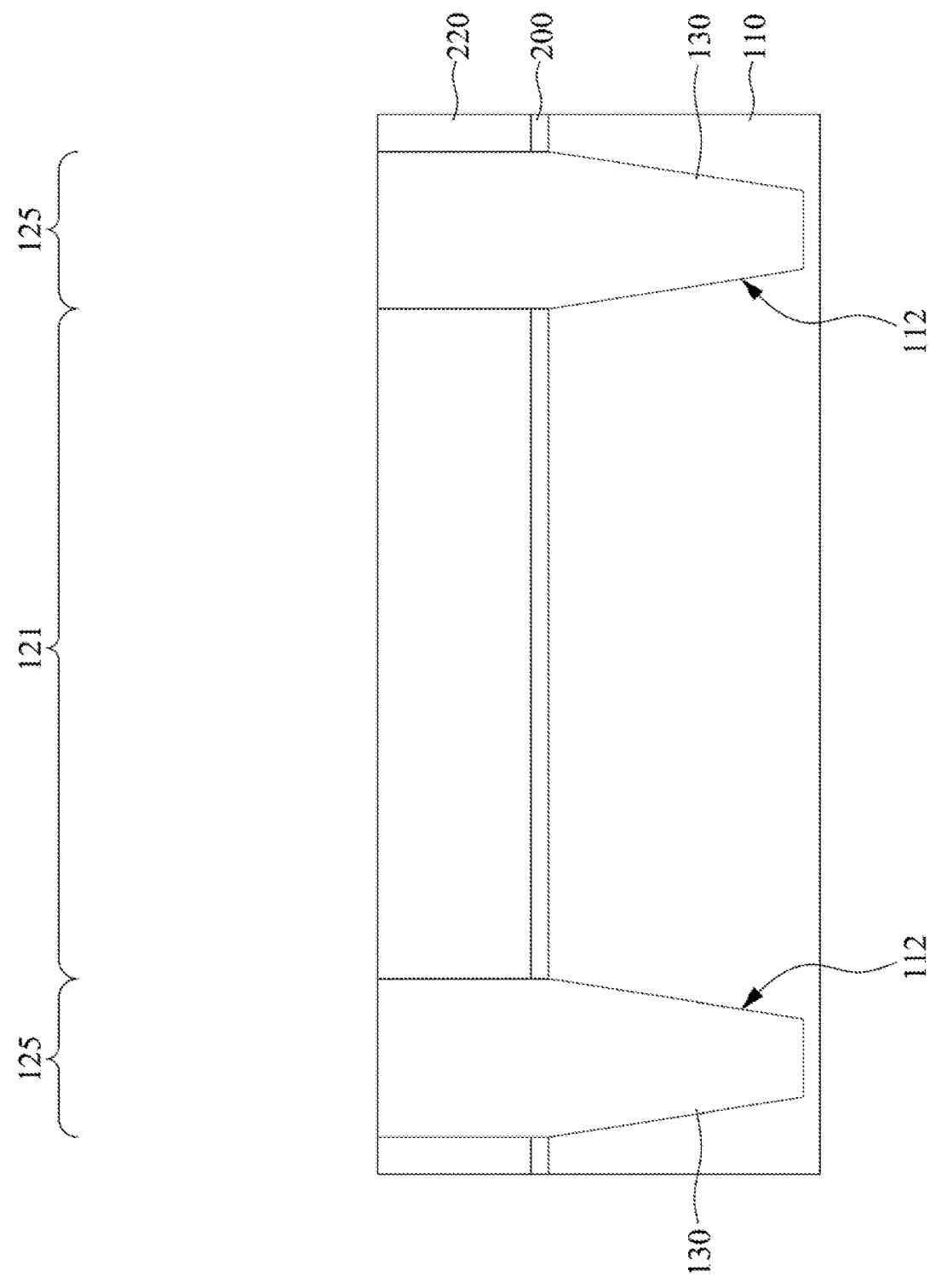

In FIG. 5, the photoresist layer 210 is removed, and an isolation structure 130 is formed in the patterned trench 221 of the mask layer 220 and the isolation trench 112 in the substrate 110. In some embodiments, a polishing process is performed after the photoresist layer 210 is removed, so that a top surface of the isolation structure is coplanar with a top surface of the mask layer 220.

In some embodiments, the isolation structure 130 is formed by a deposit process. In some embodiments, the deposit process used for forming the isolation structure 130 includes chemical vapor deposit (CVD) or other suitable deposit process. In some embodiments, the material of the isolation structure 130 includes oxide material.

Figure 6:
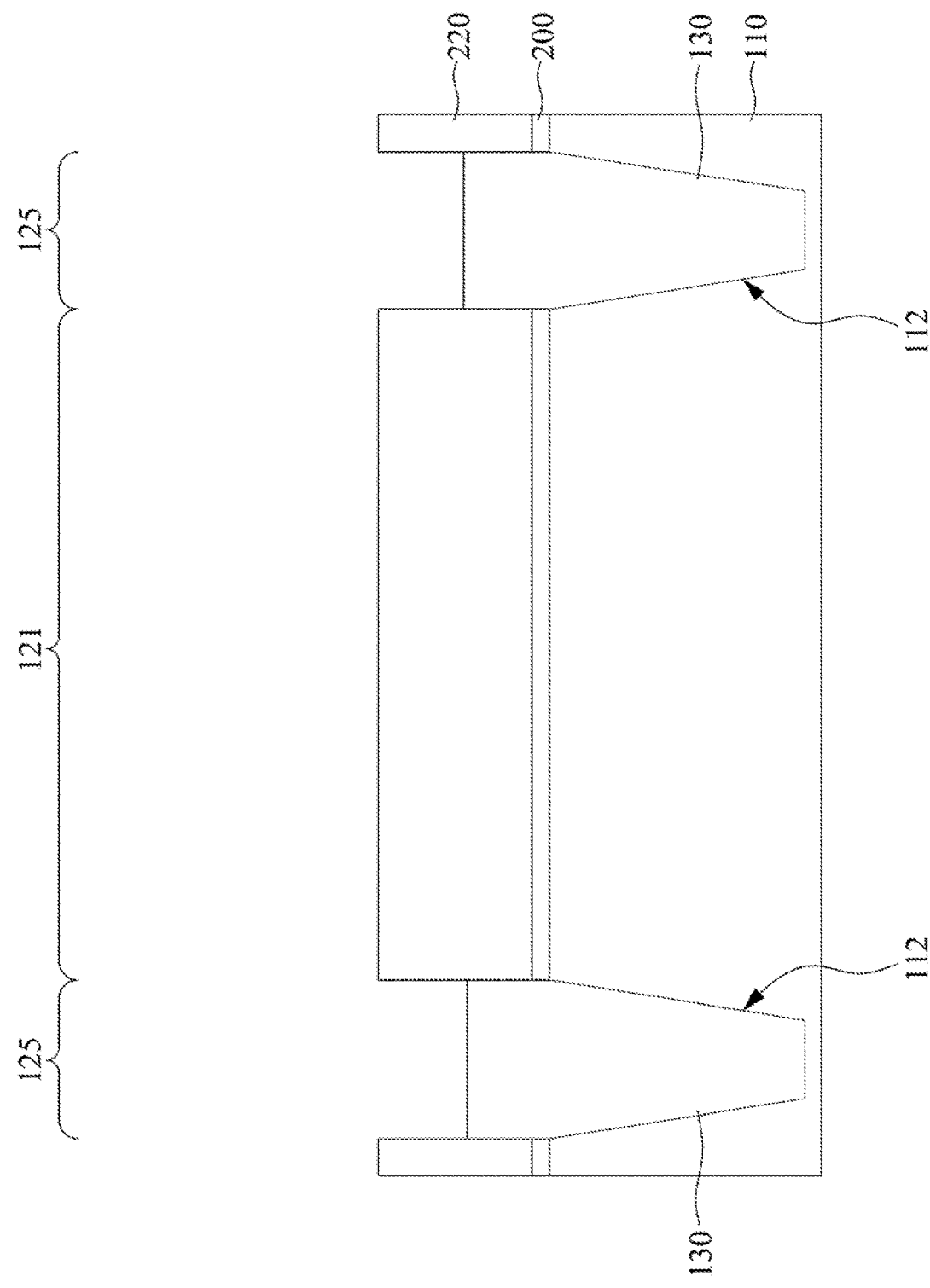

In FIG. 6, the isolation structure 130 is recessed from the top surface of the mask layer 220. Continued with FIG. 6, in FIG. 7, the mask layer 220 is removed, and the isolation structure 130 protrudes from the oxide layer 200 over the substrate 110.

Figure 8:
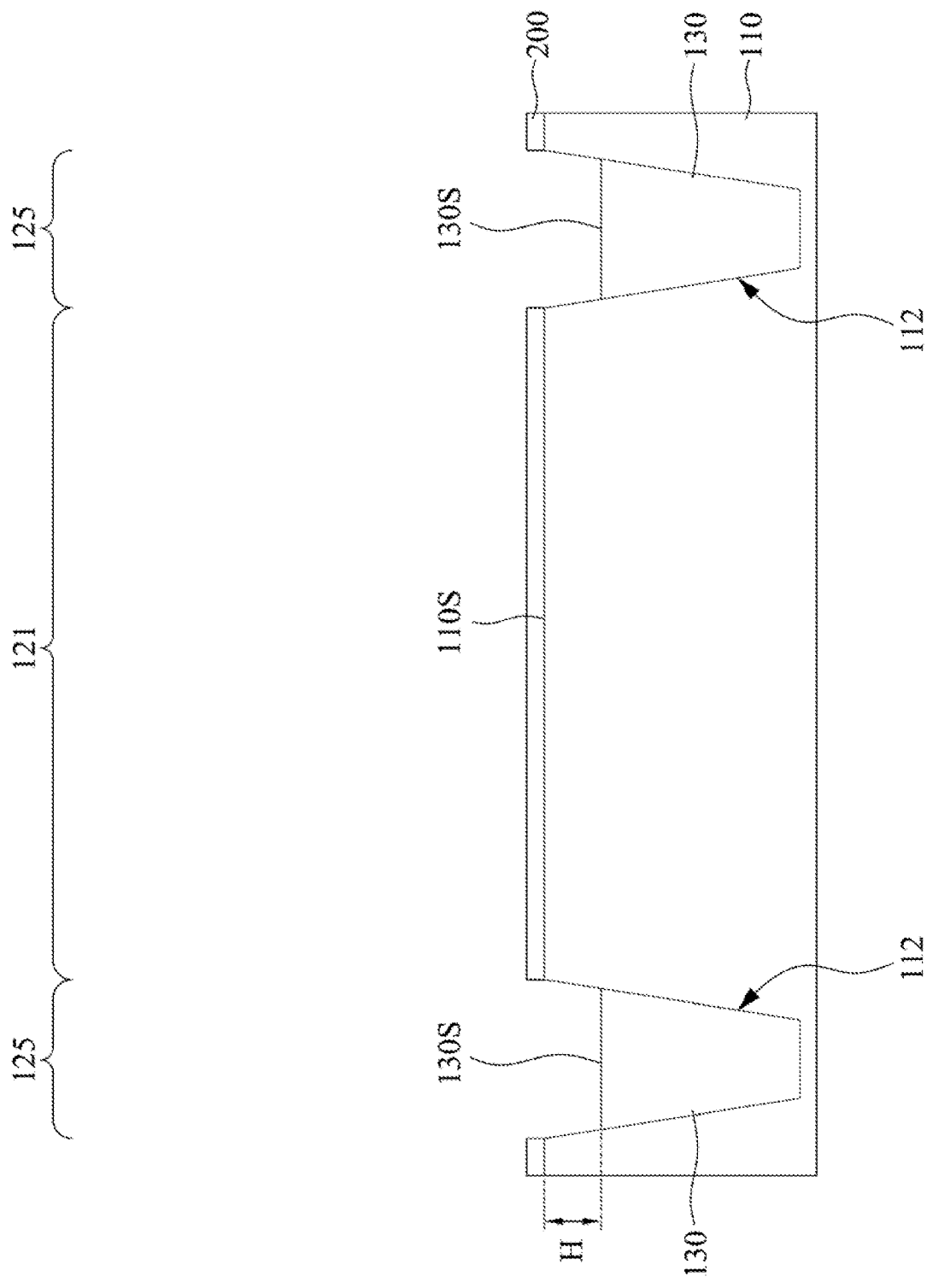

In FIG. 8, the isolation structure 130 is further recessed, so that a top surface 130S of the recessed isolation structure 130 is lower than a top surface 110S of the substrate 110. A step height H along the direction z is between the top surface 130S of the recessed isolation structure 130 and the top surface 110S of the substrate 110.

Figure 9:
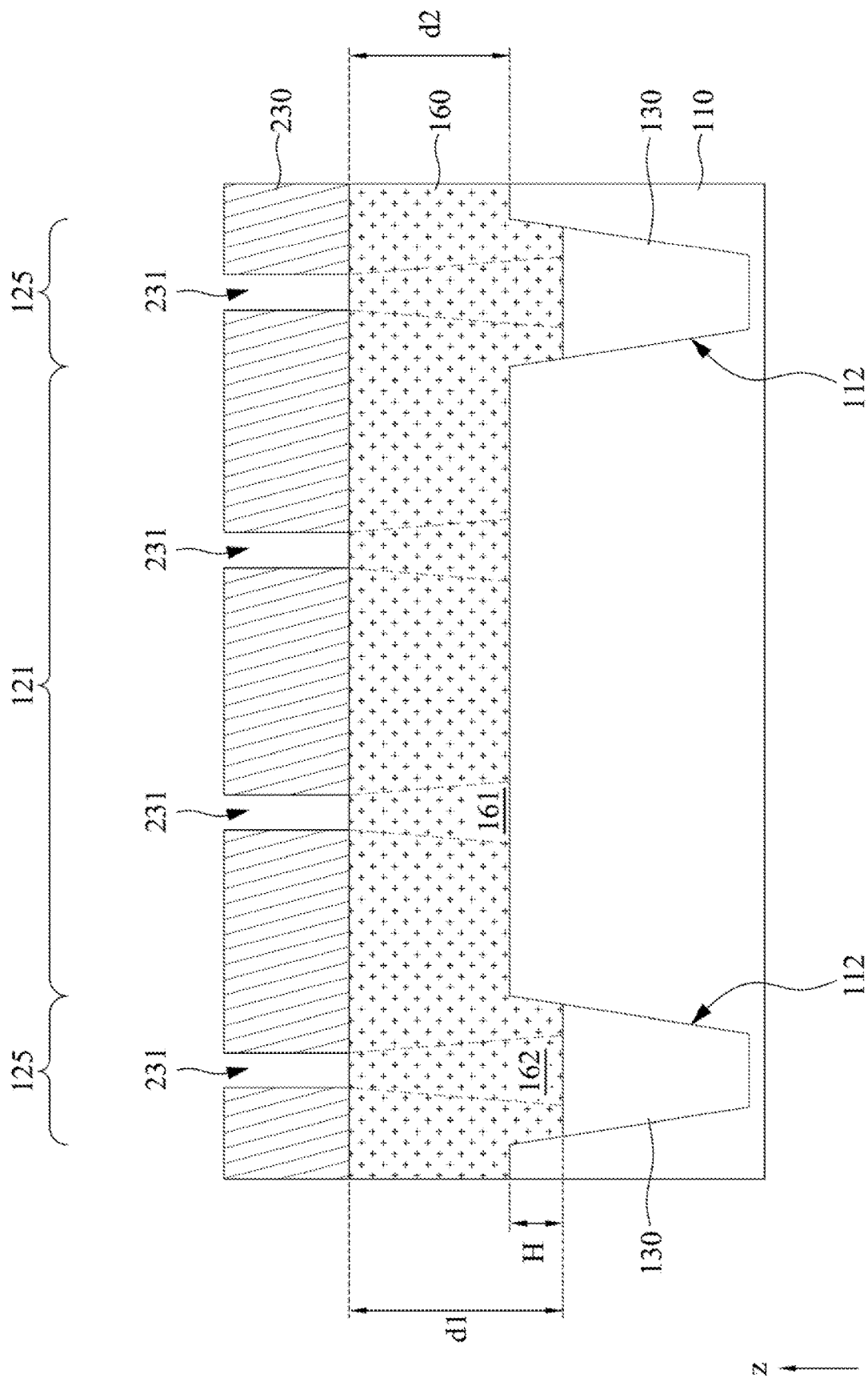

In FIG. 9, the oxide layer 200 is removed, and a second mask layer 160 and a second photoresist layer 230 are formed on the substrate 110 and cover the active areas 120 and the isolation area 125. The photoresist layer 230 is formed on the mask layer 160. The photoresist layer 230 is used for patterning the mask layer 160, so that the patterned mask layer 160 can be used to form word lines on the substrate 110. As shown in FIG. 9, the photoresist layer 230 has pattern with a plurality of slots 231. The slots 231 in the isolation area 125 are aligned with the isolation structure 130. In this embodiment, the slots 231 have the same width.

In this embodiment, the mask layer 160 is a nitride layer formed on the top surface of the active areas 120 (e.g. substrate 110 in the active area 121) and filled with spacing in the isolation trench 112. Since the step height H is provided between the top surface of the active area 121 and the top surface 130S of the recessed isolation structure 130, the mask layer 160 has different thickness in the active area 120 and the isolation area 125.

Specifically, FIG. 9 schematic illustrates the patterned trenches 161 and 162 formed based on the slots 231. The patterned trenches 161 are formed on the active area 121, and each patterned trench 161 has a depth d2 from a top surface of the mask layer 160 to the top surface of the substrate 110 in the active area 121. The patterned trenches 162 are formed in the isolation area 125, and each patterned trench 162 has a depth d1 from a top surface of the mask layer 160 to the top surface of the isolation structure 130 recessed from the isolation trench 112. In other words, the thickness of the mask layer 160 in the active area 121 is less than the thickness of the mask layer 160 in the isolation area 125.

It should be noted that the patterned trenches 161 and 162 can be formed during the same patterning process, and a width of a bottom of each patterned trench 161 extended to the substrate 110 in the active area 121 is less than a width of a bottom of each pattern trench 162 extended to the top surface 130S of the recessed isolation structure.

Figure 10:
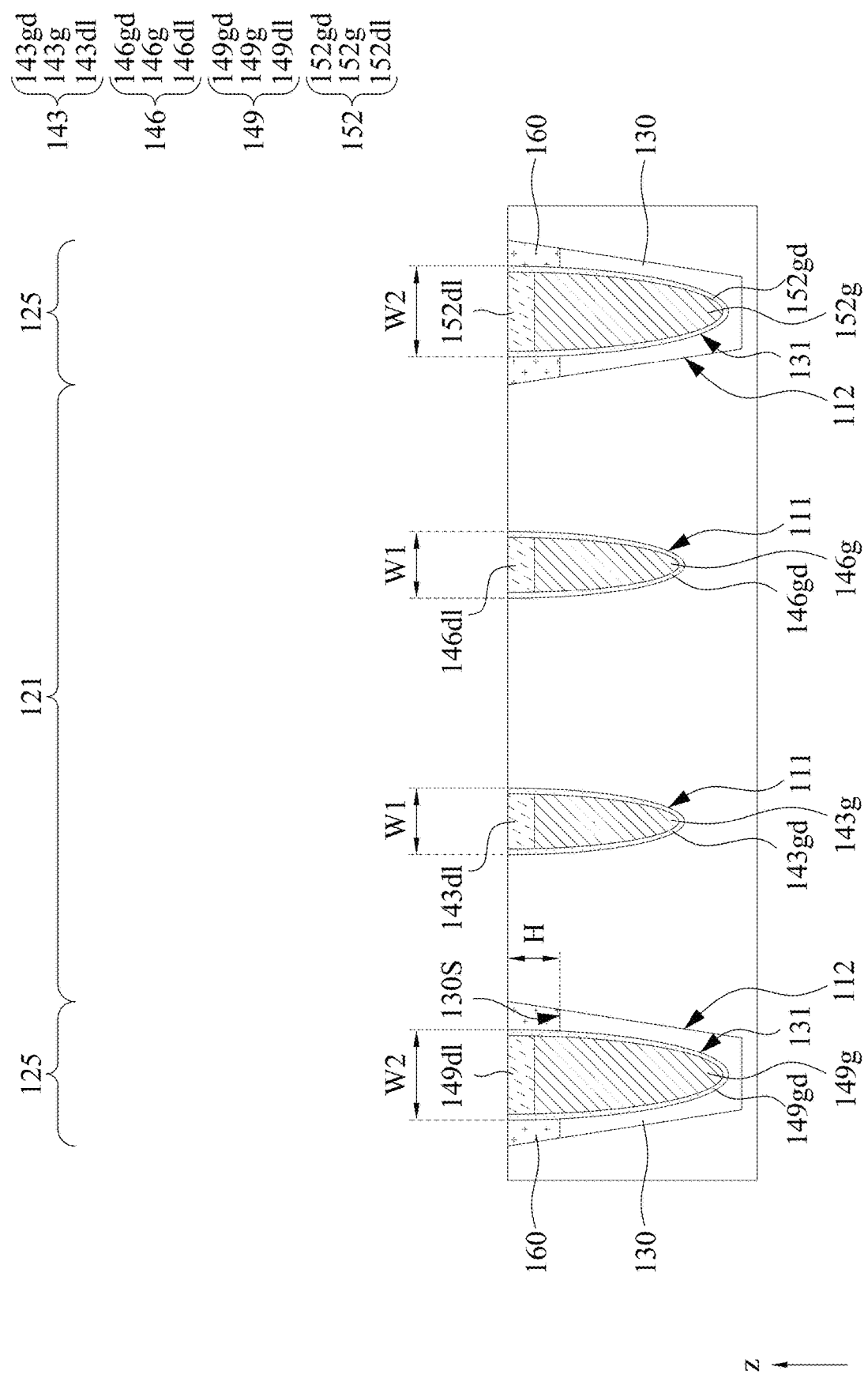

In FIG. 10, the substrate 110 and the isolation structure 130 are etched based on the patterned trenches 161 and 162 of the mask layer 160, and a plurality of word lines 143, 146, 149 and 152 are formed in a plurality of word line trenches 111 and 131.

As shown in FIG. 10, the word line trenches 111 in the active area 121 is formed based on the patterned trenches 161 in the mask layer 160 such that each of the word line trenches 111 has a width W1. The word line trenches 131 in the isolation area 125 is formed based on the patterned trenches 162 in the mask layer 160 such that each of the word line trenches 131 has a width W2, and the width W1 is less than W2.

Specifically, in some embodiments, the mask layer 160 is patterned based on the slots 231 of the photoresist layer 230 and the patterned trenches 161 and 162 are from across the mask layer 160 to expose the top surface 110S of the substrate 110 in the active area 121 and the top surface 130S of the recess isolation structure 130. The word line trenches 111 and 131 are formed based on the patterned trenches 161 and 162. The photoresist layer 230 is removed after word line trenches 111 and 131 are formed.

Each of the word line trenches 111 and 131 is formed across one or more active areas 120 and the isolation area 125. In the cross-section view of FIG. 10, two word line trenches 111 are formed across the active area 121, and two word line trenches 131 is formed in the isolation area 125 adjacent the active area 121.

Then, the word lines 143, 146, 149 and 152 are respectively deposited in the corresponding word line trenches 111 and 131. In this embodiment, the word lines 143, 146 are deposited in the word line trenches 111, which are recessed from the active area 121, and the word lines 149, 152 are deposited in the word line trenches 131, which extend across the mask layer in the word line trenches 131 and within the isolation structure 130.

In some embodiments, the depositing process for forming the word lines 143, 146, 149 and 152 can be physical vapor deposit (PVD) process, chemical vapor deposit (CVD) process and/or other suitable deposit process.

After the word lines 143, 146, 149 and 152 are formed, the mask layer 160 over the top surface 110S of the substrate 110 and beyond the word line trenches 111 and 131 are removed. In some embodiment, a polishing process is further performed such that top surfaces of the word lines 143, 146, 149 and 152, a top surface of the remained mask layer 160 and the top surface 110S of the substrate 110 are coplanar.

It should be noted that the mentioned operation is an example but not limited the present disclosure.

As shown in FIG. 10 and mentioned above, in this embodiment, each of the word lines 143, 146, 149 and 152 includes a gate dielectric (e.g. gate dielectrics 143*gd*, 146*gd*, 149*gd* and 152*gd*), a gate structure (e.g. gate structures 143*g*, 146*g*, 149*g* and/or 152*g*) and a dielectric layer (e.g. dielectric layers 143*gl*, 146*gl*, 149*gl* and/or 152*gl*). It should be noted that each of the word lines 140 is extended across one or more active areas 120 and the isolation area 125, and each of the word line 143, 146, 149 and 152 has different widths in the active areas 120 and the isolation area 125.

In some embodiments, after the word line trenches 111 and 131 are formed, the gate dielectrics (e.g. gate dielectrics 143*gd*, 146*gd*, 149*gd* and 152*gd*) are conformally formed in the corresponding word line trenches 111 and 131. For example, as shown in the cross-section view of FIG. 10, the gate dielectrics 143*gd* and 146*gd* are conformally deposited over the word line trenches 111, and the gate dielectrics 149*gd* and 15*gd* are conformally deposited over the word line trenches 131.

After the gate dielectrics 143*gd*, 146*gd*, 149*gd* and 152*gd* are deposited, the gate structures 143*g*, 146*g*, 149*g* and 152*g* are respectively deposited over the corresponding gate dielectrics 143*gd*, 146*gd*, 149*gd* and 152*gd*, and the dielectric layers 143*gl*, 146*gl*, 149*gl* and 152*gl* are deposited over the corresponding gate structures 143*g*, 146*g*, 149*g* and 152*g*, so that the gate structure 143*g*, 146*g*, 149*g* and 152*g* are covered by the corresponding dielectric layers 143*gl*, 146*gl*, 149*gl* 152*gl*.

In some embodiments, material of the gate structures (e.g. gate structures 143*g*, 146*g*, 149*g* and/or 152*g*) is conductive material.

In some embodiments, the gate dielectrics (e.g. gate dielectrics 143*gd*, 146*gd*, 149*gd* and 152*gd*) of the word lines 140 are oxide material. In some embodiments, the dielectric layer (e.g. dielectric layers 143*dl*, 146*dl*, 149*dl* and/or 152*dl*) of the word lines 140 are also oxide material. In some embodiments, material of the gate dielectrics (e.g. gate dielectrics 143*gd*, 146*gd*, 149*gd* and/or 152*gd*) is same as the dielectric layer (e.g. dielectric layers 143*dl*, 146*dl*, 149*dl* and/or 152*dl*).

In some embodiments, top of the active area 121 is implant as source/drain implant region, and the source/drain implant regions in the active areas and the gate structures of the word lines 140 form transistors. For example, the portion of the active area 121 between the word line 143 and the word line 146, the word line 143 and a portion of the active area 121 between the word line 143 and the isolation area 125 form a first transistor. The portion of the active area 121 between the word line 143 and the word line 146, and the word line 146 and a portion of the active area 121 between the word line 146 and the isolation area 125 form a second transistor. The first transistor with the gate structure 143*g* of the word line 143 and the second transistor with the gate structure 146*g* of the word line 146 form a common source structure.

In this embodiment, the recessed isolation structure 130 is an oxide filled with the isolation trench 131, and the recessed isolation structure 130 can be regarded as shallow trench isolation (STI). In some embodiment, material of the isolation structure 130 is the same as material of the oxide layer 200.

In this embodiment, the mask layer 160 remains over the recessed isolation structure 130 and is filled with the spacing between the recessed isolation structure 130 and the word line trench 131, thereby laterally surround the word lines 140 (e.g. word lines 143, 146, 149 and 152). For example, the mask layer 160 in the word line trench 131 laterally surrounds the word lines 149 and 152, as shown in cross-section view of FIG. 10.

Figure 11:
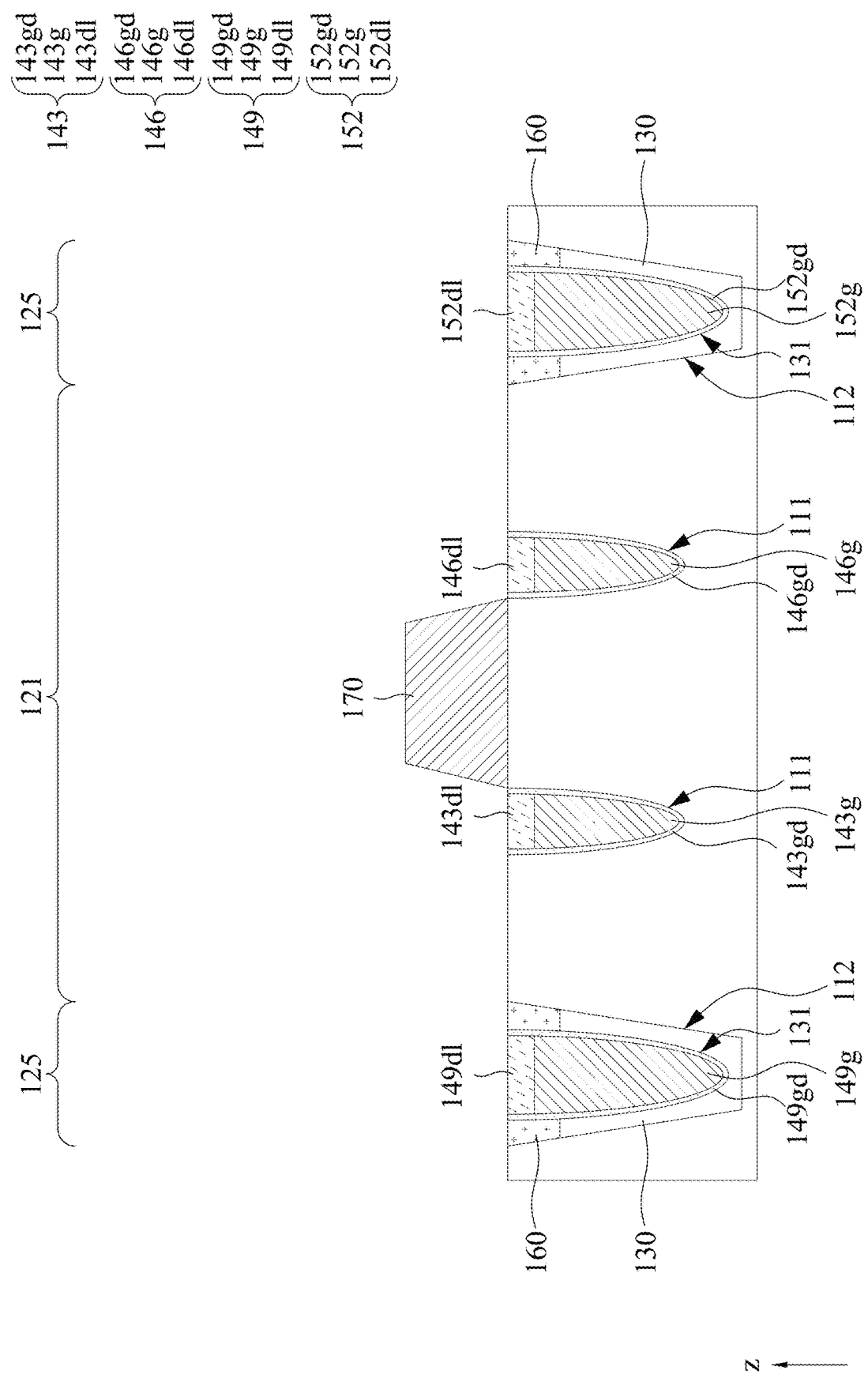

Continued with FIG. 10, in FIG. 11, a bit line structure 170 is formed on a portion of the active area 121 between the word line 143 and the word line 146. In some embodiments, the bit line structure 170 includes a bit line contact, which can be a landing pad over the substrate 110, and other further connection structures.

Figure 12:
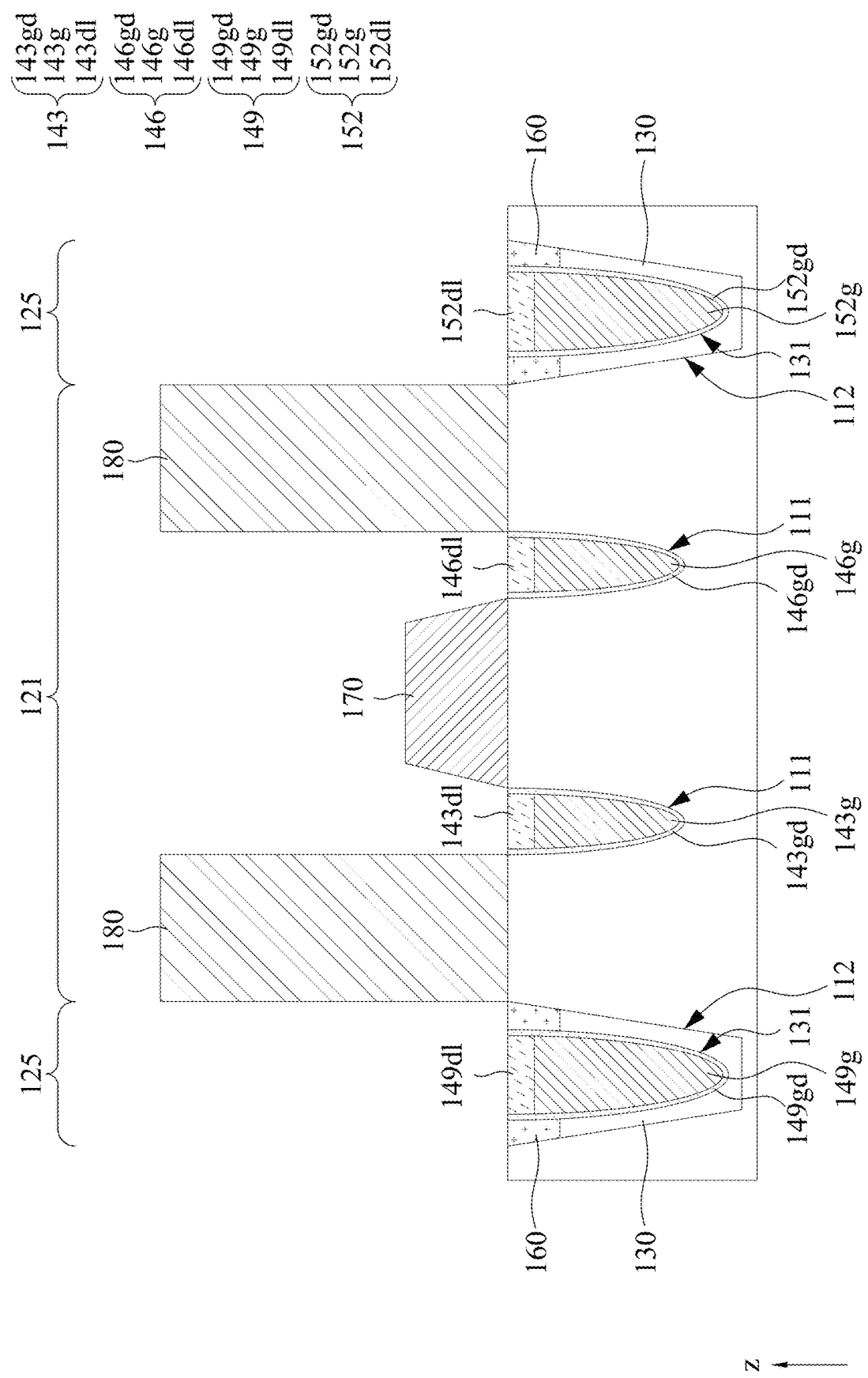

In FIG. 12, capacitors structures 180 are formed on the substrate 110. One of the capacitor structures 180 is formed between a portion of the word line 143 and the word line 149, which extends across another active area 122 and the isolation area 125 adjacent the active area 121. Another capacitor structure 180 is formed between a portion of the word line 146 and the word line 152. In some embodiments, each of the capacitor structures 180 includes a cell contact, which can be a landing pad over the substrate 110, and a capacitor formed on the cell contact. As mentioned above, one capacitor structure 180 and one of the transistors in the active area 121 form a 1T1C memory cell connected to a corresponding word line for a DRAM device. The transistor in a memory cell is a structure used to control a storage operation.

In some embodiments for a 1T1C memory cell, the capacitor structures 180 are applied with a ground potential and the bit line structure 170 is applied with a charge voltage.

Figure 13:
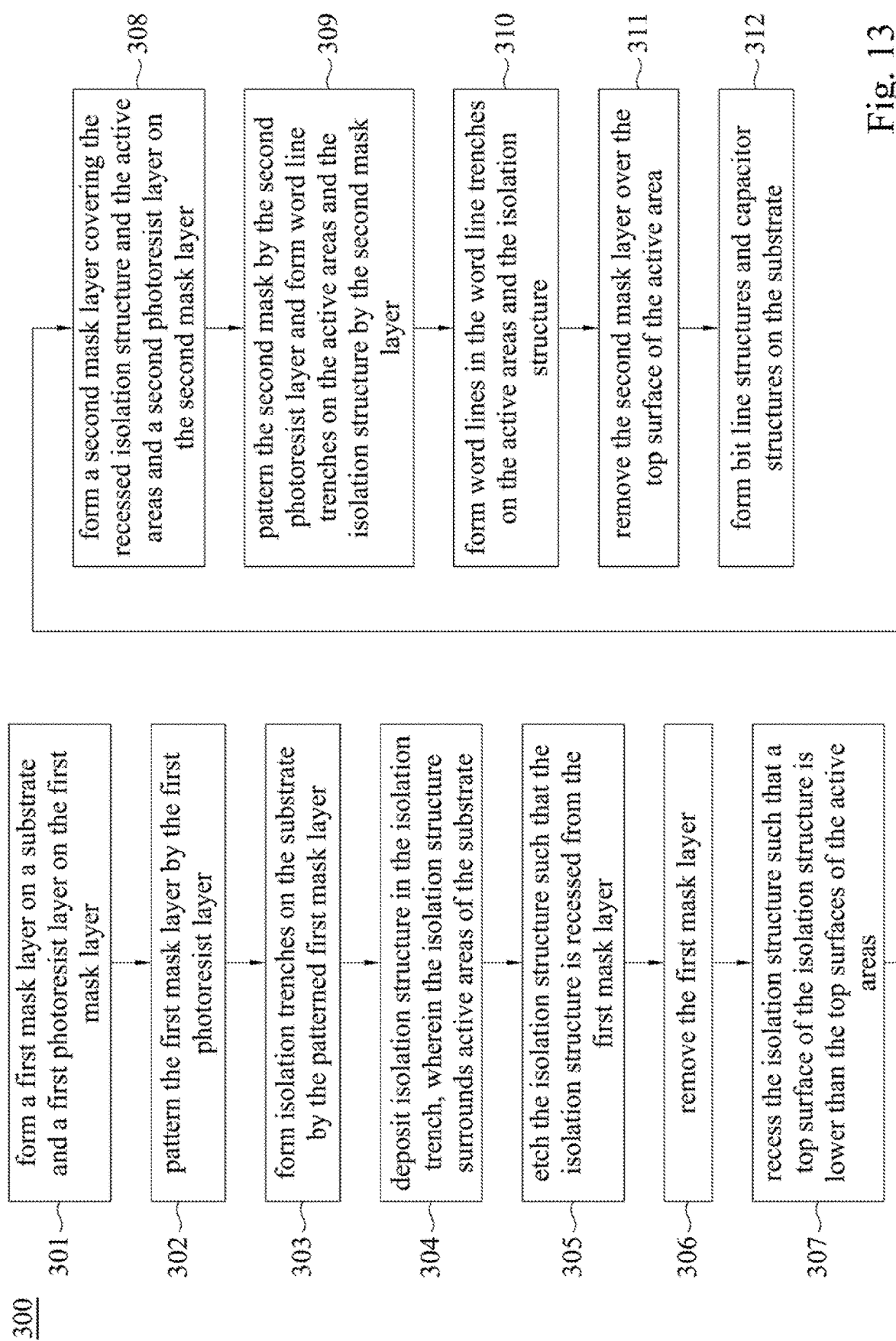
FIG. 13 illustrates a flow chart of a method of forming a memory structure of the present disclosure.

Reference is made by FIGS. 2-12 and FIG. 13. FIG. 13 illustrates a flow chart of a method 300 of forming a memory structure of the present disclosure. The method 300 includes operations 301-312, which summarized an example method of forming a memory structure of the present disclosure.

Referring to FIG. 2, in operation 301 and a first mask layer 220 is formed on a substrate 110, and a first photoresist layer 210 with pattern is formed on the first mask layer 220.

Referring to FIG. 3, in operation 302 and, the first mask layer 220 is patterned by the first photoresist layer 210.

Referring to FIG. 4, in operation 303, an isolation trench 112 is formed on the substrate 110 by the patterned first mask layer 220. The isolation trench 112 defines active areas 120 (e.g. active area 121 shown in FIG. 4) and an isolation area 125. In some embodiment, the first photoresist layer 210 is then removed.

Referring to FIG. 5, in operation 304, an isolation structure 130 is deposited in the isolation trench 131, wherein the isolation structure 130 surrounds the active areas 120 (e.g. active area 121 shown in FIG. 5) of the substrate 110.

Referring to FIG. 6, in operation 305, the isolation structure 130 is etched such that the isolation structure 130 is recessed from the first mask layer 220.

Figure 7:
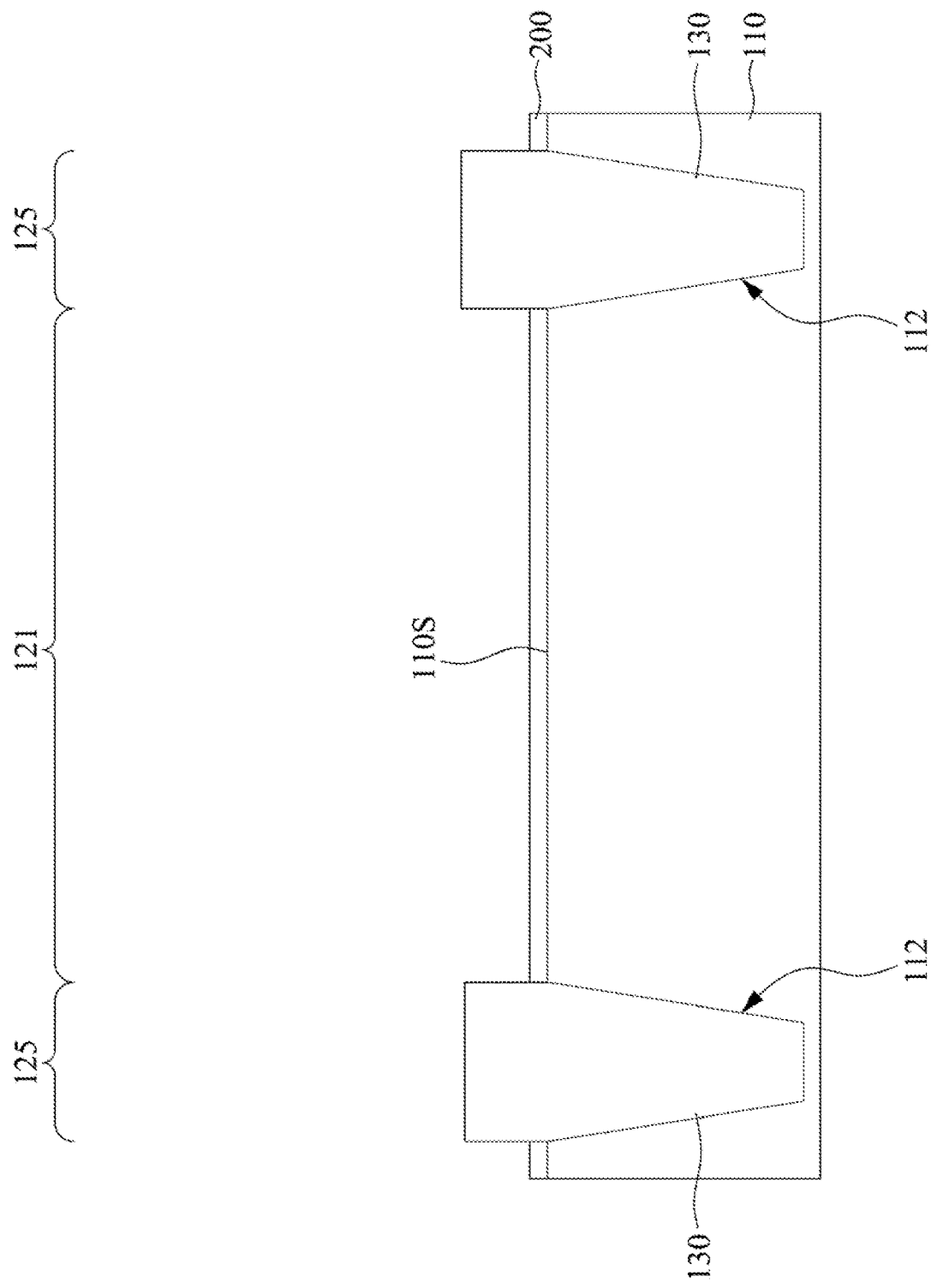

Referring to FIG. 7, in operation 306, the first mask layer 220 is removed. The first mask layer 220 protrudes from the top surface 110S of the substrate 110.

Referring to FIG. 8, in operation 307, the isolation structure 130 is further recessed from the word line trench 112, such that a top surface 130S of the isolation structure 130 is lower than the top surfaces of the active areas 120 (e.g. the top surface 110S of the substrate 110 in the active area 121).

Referring to FIG. 9, in operation 308, a second mask layer 160 and a second photoresist layer 230 are formed. The second mask layer 160 covers the recessed isolation structure 130 and the active areas 120 (e.g. active area 121). The second photoresist layer 230 is formed on the second mask layer 160.

Also referring to FIG. 9, in operation 309, by the second mask layer 160, the second mask layer 160 is patterned by the second photoresist layer 230, and word line trenches 111 and 131 are formed on the active areas 120 and the isolation structure 130.

Referring to FIG. 10, in operation 310, a plurality of word lines 143, 146, 149 and 152 are formed in the word line trenches 111 and 131 on the active areas 120 and the isolation structure 130.

Also referring to FIG. 10, in operation 311, a portion of the second mask layer 160 over the top surface of the active area 120 is removed.

Referring to FIGS. 11 and 12, in operation 312, a plurality of bit line structures 170 and a plurality of capacitor structures 180 are formed on the substrate 110.

In summary, for an example memory structure provided in the present disclosure, widths of the word lines in different positions can be controlled by introduce a step height between the isolation structure and the top surface of the active area, so that corners of the word lines at boundaries of different region have smooth rounding shapes. The rounding shapes of the word lines at the boundary between the isolation area and the active areas avoid unexpectedly providing high electric field, and the GIDL can be reduced.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this invention provided they fall within the scope of the following claims.

What is claimed is:

1. A memory structure, comprising:
   a substrate;
   an isolation area and a plurality of active areas, formed on the substrate, wherein the isolation area surrounds the active areas, the isolation area comprises an isolation structure formed in an isolation trench recessed in the isolation area, and a top surface of the isolation structure is lower than top surfaces of the active areas;
   a first word line formed across a first active area of the active areas and the isolation area, wherein the first word line has a first width in the first active area and a second width in the isolation area, and the first width is less than the second width, a topmost surface of the isolation structure is lower than a top surface of the first word line, and a level of the topmost surface of the isolation structure is between a level of the top surface of the first word line and a level of a lowest point of the first word line in a cross-sectional view; and
   a mask layer formed in the isolation trench and upon the top surface of the isolation structure, wherein the mask layer laterally surrounds the first word line in the isolation area, and a top surface of the mask layer is coplanar with the top surface of the first active area and a top surface of the first word line.

2. The memory structure of claim 1, further comprising:
   a second word line formed across the isolation area and the first active area, wherein the second word line has the first width in the first active area and the second width in the isolation area; and
   a bit line structure formed on the first active area and located at a portion of the first active area between the first word line and the second word line.

3. The memory structure of claim 2, wherein the portion of the first active area between the first word line and the second word line, the first word line and a portion of the first active area between the first word line and the isolation area form a first transistor, the portion of the first active area between the first word line and the second word line, and the second word line and a portion of the first active area between the second word line and the isolation area form a second transistor.

4. The memory structure of claim 1, further comprising:
   a third word line formed across the isolation area and a second active area of the active areas, wherein the third word line has the first width in the second active area and the second width in the isolation area; and a capacitor structure formed on the first active area and between the first word line and the third word line.

5. The memory structure of claim 1, wherein the first word line is formed within a first word line trench across the first active area and the isolation area, the first word line comprises:
- a gate dielectric conformally formed in the first word line trench;
- a gate structure formed on the gate dielectric; and
- a dielectric layer being formed in the first word line trench and covering the gate structure.

6. The memory structure of claim 5, wherein a top surface of the isolation structure is lower than a top surface of the dielectric layer.

7. A memory structure, comprising:
- a substrate having a plurality of active areas and an isolation area surrounding the active areas, wherein the isolation area comprises an isolation structure recessed from a top surface of the substrate, wherein a top surface of the isolation structure is lower than top surfaces of the active areas;
- a first word line formed across a first active area of the active areas and the isolation structure of the isolation area, wherein a topmost surface of the isolation structure is lower than a top surface of the first word line, and a level of the topmost surface of the isolation structure is between a level of the top surface of the first word line and a level of a lowest point of the first word line in a cross-sectional view; and
- a mask layer formed in an isolation trench in the isolation area and upon the top surface of the isolation structure, wherein the mask layer laterally surrounds the first word line in the isolation area, and a top surface of the mask layer is coplanar with the top surface of the first active area and a top surface of the first word line.

8. The memory structure of claim 7, wherein the first word line has a first width in the first active area and a second width in the isolation area, and the first width is less than the second width.

9. The memory structure of claim 8, wherein the first word line is extended along a first direction different from a second direction in which the active areas are extended, and first sections with the first width and second sections with the second width of the first word line are alternately arranged along the first direction.

10. The memory structure of claim 8, further comprising:
- a second word line formed across the isolation area and the first active area, wherein the second word line has the first width in the first active area and the second width in the isolation area; and
- a bit line structure formed on the first active area and located at a portion of the first active area between the first word line and the second word line.

11. The memory structure of claim 8, further comprising:
- a third word line formed across the isolation area and a second active area of the active areas, wherein the third word line has the first width in the second active area and the second width in the isolation area; and
- a capacitor structure formed on the first active area and between the first word line and the third word line.

* * * * *